US012578380B2

(12) United States Patent
Kim et al.

(10) Patent No.: US 12,578,380 B2
(45) Date of Patent: Mar. 17, 2026

(54) INTEGRATED ACTUATOR TEST SYSTEM AND METHOD FOR OPERATING THE SAME

(71) Applicant: PAMTEK Co., Ltd., Hwaseong-si (KR)

(72) Inventors: Jae Woong Kim, Hwaseong-si (KR); Jung In Park, Hwaseong-si (KR); Hyun Wook Shin, Suwon-si (KR); Hee Tae Kim, Hwaseong-si (KR)

(73) Assignee: PAMTEK CO., LTD., Hwaseong-si (KR)

( * ) Notice: Subject to any disclaimer, the term of this patent is extended or adjusted under 35 U.S.C. 154(b) by 466 days.

(21) Appl. No.: 18/112,703

(22) Filed: Feb. 22, 2023

(65) Prior Publication Data

US 2024/0264223 A1     Aug. 8, 2024

(30) Foreign Application Priority Data

Feb. 2, 2023     (KR) ........................ 10-2023-0014298

(51) Int. Cl.
G01R 31/28     (2006.01)
G01R 1/04     (2006.01)
G03B 43/00     (2021.01)

(52) U.S. Cl.
CPC ..... G01R 31/2863 (2013.01); G01R 31/2867 (2013.01); G03B 43/00 (2013.01); G01R 1/0408 (2013.01); G01R 31/2829 (2013.01)

(58) Field of Classification Search
CPC .............. G03B 43/00; G01R 31/00–74; G01R 1/00–0491
See application file for complete search history.

(56) References Cited

U.S. PATENT DOCUMENTS

| | | | | |
|---|---|---|---|---|
| 8,773,539 B2 * | 7/2014 | Lee | ....................... | H04N 17/002 |
| | | | | 356/124 |
| 10,440,357 B2 * | 10/2019 | Schmack | ............. | H04N 17/002 |
| 10,656,206 B1 * | 5/2020 | Patil | ................. | G01R 31/31905 |
| 11,143,673 B2 * | 10/2021 | Hong | ..................... | H04N 23/54 |
| 2021/0389211 A1 * | 12/2021 | Cao | ................... | G02F 1/133602 |
| 2022/0116585 A1 * | 4/2022 | Lee | ......................... | H04N 17/00 |

FOREIGN PATENT DOCUMENTS

| | | | | | |
|---|---|---|---|---|---|
| KR | 1921021 B1 | | 11/2018 | | |
| KR | 20190033167 A | * | 3/2019 | .............. | H04M 1/24 |
| KR | 20210060112 A | * | 5/2021 | ........... | G01R 1/0408 |
| KR | 20210148026 A | * | 12/2021 | ........... | H04N 17/002 |
| WO | WO-2010119507 A1 | * | 10/2010 | ........ | G01R 31/2887 |

* cited by examiner

*Primary Examiner* — Judy Nguyen
*Assistant Examiner* — James Split
(74) *Attorney, Agent, or Firm* — Tucker Ellis LLP

(57) ABSTRACT

An integrated actuator test system for performing the first test and the second test and a method for operating the system. The test system includes a control unit controlling an operation of the test system; a support socket supporting the actuator; an alignment stage supporting the support socket and determining a direction of the support socket; and a transporting unit transporting the alignment stage to perform the second test after performing the first test.

2 Claims, 10 Drawing Sheets

Direction perpendicular
to the ground

The first direction

The second direction (a)

(b)

INTEGRATED ACTUATOR TEST SYSTEM AND METHOD FOR OPERATING THE SAME

RELATED APPLICATION DATA

This application claims the benefit of South Korean Patent Application No. 10-2023-0014298, filed Feb. 2, 2023, the disclosure of which is incorporated herein by reference in its entirety.

BACKGROUND OF THE INVENTION

1. Technical Field

The present disclosure relates to an integrated actuator test system and a method of operating the system. More specifically, a plurality of tests can be performed with one system, and the alignment state of actuators to be tested can be quickly checked and corrected at each test position.

2. Description of Related Art

With the development of smart devices, the use of small camera modules is rapidly increasing. Camera modules are being installed not only in portable devices such as smart phones, tablet PCs and laptops, but also in automobiles and smart TVs.

A typical camera module includes a housing, a lens barrel in which a plurality of lenses is stacked, an actuator, a CCD or CMOS image sensor, and a connector electrically connecting a board on which they are mounted and the outside.

At this time, the actuator constituting the camera module functions to control the lens so that it does not shake despite handshake or vibration from the surroundings. In the process of assembling these actuators, parts of the actuators must be transferred to a plurality of assembly devices. In addition, in order to inspect whether the assembly is properly performed or whether the actuator operates correctly, the actuator needs to be transported to a plurality of test devices that perform specific tests. A plurality of assembling devices may perform assembling by receiving parts of the actuator having a predetermined orientation for assembly.

However, the alignment of the actuators may be disturbed while being transported, and when the alignment of the actuators with respect to the test device or the assembly device is disturbed, test or assembly may not be performed properly. In addition, when test or assembly is attempted while the alignment is disturbed, a force is applied to the actuator and the actuator may be damaged.

Conventionally, in order to align a test object such as an actuator with a test device or an assembly device, a method of inserting and aligning a test object into a mechanical frame at a predetermined position has been used in some cases. However, since the test device or assembly device includes many parts, the mechanical coupling becomes loose over time, resulting in a high defect rate.

On the other hand, there is a demand for a technology that reduces the overall test time by allowing multiple tests to be performed in one system in one line, but even if the actuators are aligned in the first test, there is a need to move the actuator to the second test position. In the process, the alignment is disturbed again, so there is a problem that the test after the first test is not performed properly.

SUMMARY OF THE INVENTION

An object of the present invention to solve the above problems is to provide an integrated actuator test system that performs a plurality of tests with one system and quickly aligns in each test so that the entire test can be performed smoothly. Another object of the present invention is to provide an integrated actuator test system for correct alignment between an actuator to be tested and a test board or a measurement using a camera and an alignment stage.

In order to achieve the above purposes, the present integrated actuator test system as an integrated actuator test system for performing the first test and the second test on the actuator, comprises a control unit controlling an operation of the test system; a support socket supporting the actuator; an alignment stage supporting the support socket and determining a direction of the support socket; and/or a transporting unit transporting the alignment stage to perform the second test after performing the first test. Preferably, the test system, for the second test, comprises a measurement performing the second test; a measurement alignment stage supporting the measurement and determining the direction of the measurement; a positioning unit supporting the measurement alignment stage and determining the position of the measurement alignment stage; and/or a support plate supporting the positioning unit.

Preferably, the measurement alignment stage may adjust the measurement direction of the measurement in all directions in consideration of the flatness of the alignment stage at the position for the second test.

Preferably, the test system, for the first test, may further comprises an alignment camera spaced apart from the upper side of the support socket by a predetermined distance and fixed at a predetermined position to photograph an alignment state of the actuator placed on the support socket; a test driving unit positioned in a first direction of the alignment stage and configured to move a test board in the first direction or in a direction opposite to the first direction; and/or a test board coupled to an upper side of the test board driving unit and for testing the actuator on the support socket, and wherein the first direction is a direction parallel to the ground.

Preferably, the alignment stage comprises a first stage for moving the support socket in a second direction or in a direction opposite to the second direction; a second stage coupled to the upper side of the first stage to move the support socket in the first direction or in a direction opposite to the first direction; and a third stage coupled to the upper side of the second stage to rotate the support socket about an axis perpendicular to the ground, and the first direction and the second direction are directions perpendicular to each other.

A method for operating an integrated actuator test system according to another embodiment of the present disclosure as a method of operating an integrated actuator test system to perform a first test and a second test on an actuator, may include performing a first test on the actuator; transporting the actuator to a position for the second test; adjusting and aligning a measuring direction of a measurement in all directions in consideration of the flatness of the actuator at the position for the second test; and/or performing a second test on the actuator.

The present invention can provide an integrated actuator test system that performs a plurality of tests with one system and quickly allows quick alignment in each test so that the entire test can be smoothly performed.

The present invention can provide an integrated actuator test system for correct alignment between an actuator to be tested and a test board or a measurement using a camera and an alignment stage.

DESCRIPTION OF THE PREFERRED EMBODIMENTS

Figures 1, 2:
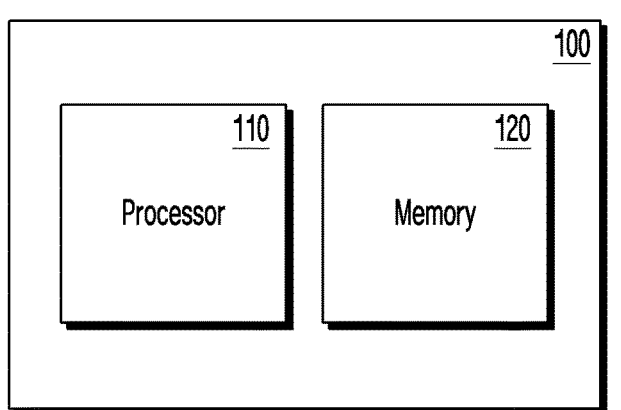
FIG. 1 discloses a hardware component of a control unit according to an embodiment of the present disclosure.
FIG. 2 is a view showing hardware of a test system according to an embodiment of the present disclosure.

Advantages and features of the disclosed embodiments, and methods of achieving them, will become apparent with reference to the following embodiments in conjunction with the accompanying drawings. However, the present disclosure is not limited to the embodiments disclosed below and may be implemented in various different forms, only the present embodiments make the present disclosure complete, and it is provided to those skilled in the art in the art to which the present disclosure belongs only to fully inform them of the scope of the invention.

Terms used in this specification will be briefly described, and the disclosed embodiments will be described in detail.

The terms used in this specification have been selected from general terms that are currently widely used as much as possible while considering the functions in the present disclosure, but they may vary depending on the intention or precedent of a person skilled in the related field, the emergence of new technologies, and the like. In addition, in a specific case, there is also a term arbitrarily selected by the applicant, and in this case, the meaning will be described in detail in the description of the invention. Therefore, terms used in the present disclosure should be defined based on the meaning of the term and the general content of the present disclosure, not simply the name of the term.

Expressions in the singular number in this specification include plural expressions unless the context clearly dictates that they are singular. Also, plural expressions include singular expressions unless the context clearly specifies that they are plural.

When it is said that a certain part "includes" a certain component throughout the specification, it means that it may further include other components without excluding other components unless otherwise stated.

Also, the term "unit" used in the specification means a software or hardware component, and "unit" performs certain roles. However, "unit" is not meant to be limited to software or hardware. A "unit" may be configured to reside in an addressable storage medium and may be configured to reproduce one or more processors. Thus, as an example, "unit" includes components such as software components, object-oriented software components, class components and task components, processes, functions, properties, procedures, subroutines, segments of program code, drivers, firmware, microcode, circuits, data, databases, data structures, tables, arrays and variables. Functionality provided within components and "unit" may be combined into fewer components and "units" or further separated into additional components and "units".

According to an embodiment of the present disclosure, "unit" may be implemented as a processor and a memory. The term "processor" should be interpreted broadly to include general-purpose processors, central processing units (CPUs), microprocessors, digital signal processors (DSPs), controllers, microcontrollers, state machines, etc. In some circumstances, "processor" refers to application specific integrated circuits (ASICs), programmable logic devices (PLDs), field programmable gate arrays (FPGAs), etc. The term "processor" refers to a combination of processing devices, such as, for example, a combination of a DSP and a microprocessor, a combination of a plurality of microprocessors, a combination of one or more microprocessors in conjunction with a DSP core, or any other such component.

The term "memory" should be interpreted broadly to include any electronic component capable of storing electronic information. The term memory can refer to various types of processor-readable media such as random access memory (RAM), read-only memory (ROM), non-volatile random access memory (NVRAM), programmable read-only memory (PROM), erasable-programmable read-only memory (EPROM), electrical may refer to various types of processor-readable media, such as erasable PROM (EE-PROM), flash memory, magnetic or optical data storage, registers, and the like. A memory is said to be in electronic communication with the processor if the processor can read information from and/or write information to the memory. Memory integrated with the processor is in electronic communication with the processor. A memory is said to be in electronic communication with the processor if the processor can read information from and/or write information to the memory. Memory integrated with the processor is in electronic communication with the processor.

Hereinafter, with reference to the accompanying drawings, embodiments will be described in detail so that those skilled in the art can easily carry out the embodiments. And in order to clearly describe the present disclosure in the drawings, parts irrelevant to the description are omitted.

FIG. 1 disclosures a hardware component of a control unit according to an embodiment of the present disclosure.

The test system 200 for testing an actuator may include a control unit 100 for controlling an operation of the test system. The control unit 100 may include a processor 110 and a memory 120. The processor 110 may execute instructions stored in the memory 120. The control unit 100 may control movement of components included in the test system based on commands stored in the memory 120. The control unit 100 may be implemented in hardware or software. The control unit 100 may be implemented only with hardware for performing a corresponding function. However, it is not limited thereto, and the control unit 100 may be implemented as a general-purpose processor 110, and the general-purpose processor 110 of the control unit 100 may be implemented to execute a program stored in the memory 120. Hereinafter, components included in the test system will be described, and a process for the control unit 100 to control various components included in the test system will be described.

FIG. 2 is a view showing hardware of a test system according to an embodiment of the present disclosure.

Since the control unit 100 has already been described, the remaining hardware constituting the test system 200 will be described in more detail below.

Referring to FIG. 2, the test system 200 may include a base unit 250 forming a skeleton of the test system 200. The base unit 250 may be implemented with a metal material. In addition, the base unit 250 may include a test board accommodating unit 311 for accommodating the test board 240 and a stage accommodating unit 312 for accommodating the alignment stage 220. The positions of the test board accommodating unit 311 and the stage accommodating unit 312 can be determined so that a space where a camera for aligning the position of the actuator or a test board for testing the actuator can be located above the actuator is secured. In addition, since all of the devices for alignment and test are located above the actuator, the moving distance of the devices is shortened and the test time is shortened, thereby increasing test efficiency.

The control unit 100 may receive data from the server or transmit data to the server. The control unit 100 may control the operation of at least one of the alignment camera 210 and the alignment stage 220.

Figure 3:
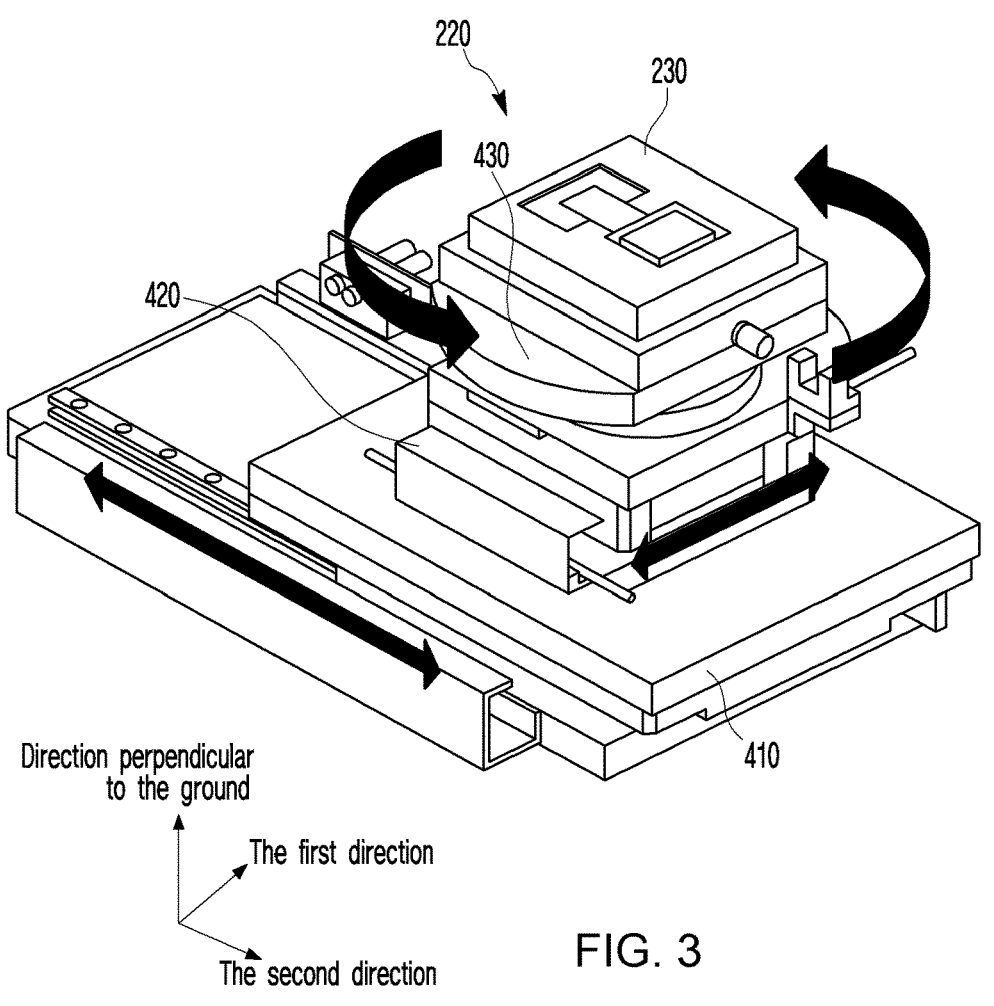
FIG. 3 is a view showing an alignment stage according to an embodiment of the present disclosure.

The test system 200 may include an alignment stage 220. The alignment stage 220 may be coupled to the upper side of the base part 250. More specifically, the alignment stage 220 may be coupled to the upper side of the stage accommodating unit 312. The alignment stage 220 may be configured to determine the direction of the support socket 230. FIG. 3 is briefly referred for a description of the alignment stage 220.

FIG. 3 is a view showing an alignment stage according to an embodiment of the present disclosure.

The alignment stage 220 may include a first stage 410, a second stage 420, and a third stage 430.

The first stage 410 may be coupled to the upper side of the base unit 250. The first stage 410 may be configured to move the support socket 230 in a second direction or in a direction opposite to the second direction. Hereinafter, the first stage 410 will be mainly described as having a component for moving the support socket 230 in a second direction or in a direction opposite to the second direction. However, it is not limited thereto, and the first stage 410 may be configured to move the support socket 230 in a first direction or in a direction opposite to the first direction. The first direction and the second direction may be directions parallel to the ground, and the first direction and the second direction may be perpendicular to each other.

The first stage 410 may include a base stage coupled to the base unit 250. A second direction guide rail may be formed above the base stage. The second direction guide rail may extend in the second direction. The first stage 410 may include a second directional movement stage on the base stage. A lower side of the second directional movement stage may include a slider. The slider of the second direction moving stage is coupled to the second direction guide rail of the base stage to slide in a second direction or in a direction opposite to the second direction. A first direction guide rail may be formed above the second direction movement stage. The first direction guide rail may extend in the first direction. The first direction guide rail may be configured to move the second stage 420 in a first direction or in a direction opposite to the first direction.

The second stage 420 may be coupled to an upper side of the first stage to move the support socket in a first direction or in a direction opposite to the first direction. A slide may be included on the lower side of the second stage 420. The slider of the second stage 420 is coupled to the guide rail in the first direction of the second directional movement stage and can slide in a first direction or in a direction opposite to the first direction. As already described, the second directional movement stage may be included in the first stage 410.

In the present disclosure, the second stage 420 is described as being configured to move the support socket in a first direction or in a direction opposite to the first direction, but is not limited thereto. The second stage 420 may be configured to move the support socket 230 in a second direction or in a direction opposite to the second direction.

The third stage 430 may be coupled to the upper side of the second stage to rotate the support socket about an axis perpendicular to the ground. As described above, since the test system of the present disclosure includes the first stage 410, the second stage 420, and the third stage 430, the actuator to be tested can be positioned at an accurate position. Accordingly, damage to the actuator connector can be minimized. In addition, since only the actuators need to be aligned in an accurate position, the other components move to a predetermined position to perform the test, so the test speed can be increased.

The movement of the first stage 410, the second stage 420, and the third stage 430 may be controlled by the control unit 100. Also, each of the first stage 410, the second stage 420, and the third stage 430 may include a driving unit. The driving unit may include at least one of a fluid cylinder and an electric motor. The first stage 410, the second stage 420, and the third stage 430 can be independently driven by the control unit 100. Each of the first stage 410, the second stage 420, and the third stage 430 may include an encoder. The control unit 100 may measure the position of the actuator in the first direction and the position of the actuator in the second direction and a position of the actuator based on an axis perpendicular to the ground based on the encoders included in the first stage 410, the second stage 420, and the third stage 430, respectively. In addition, the control unit 100 may measure positions after being moved by the driving unit by means of encoders included in the first stage 410, the second stage 420, and the third stage 430, respectively.

The size (width, length, height) of the first stage 410 and the second stage 420 may be approximately 70×70×25 mm. The maximum force of the driving units of the first stage 410 and the second stage 420 may be about 36N. Also, the resolution may be approximately 0.1 um (micrometer), and the maximum speed may be approximately 270 mm/s.

The size of the third stage 430 may be approximately 70×82×25 mm. The maximum torque of the third stage 430 may be about 0.6 Nm. Also, the resolution may be approximately 5847 pulse/degree, and the maximum speed may be approximately 720 degree/s.

Referring to FIG. 2, the test system 200 may include a support socket 230. The support socket 230 is coupled to the upper side of the alignment stage 220 and may be configured to support the actuator. More specifically, the support socket 230 may be fixed to an upper end of the third stage 430. The support socket 230 moves in a first direction, in a direction opposite to the first direction, in a second direction, or in a direction opposite to the second direction by the first stage 410 to the third stage 430, or can rotate clockwise or counterclockwise around an axis perpendicular to the ground.

The test system 200 may include an alignment camera 210. The alignment camera 210 may be spaced apart from the upper side of the support socket 230 by a predetermined distance. Since no other equipment is provided on the upper side of the support socket 230 and the alignment camera 210 can be separated by a sufficient distance from the support socket 230, a relatively inexpensive camera can be used. Conventionally, since the position of the test equipment as well as the actuator had to be measured, there was a case where the alignment camera 210 was located at the bottom of the support socket 230, and there was a case where a close-up camera was needed because there was not enough space at the bottom. In this case a relatively expensive camera was used.

The alignment camera 210 may be configured to photograph the alignment state of the actuator placed on the support socket, and may be fixed at a predetermined position. When a managing person initially determines the location of the alignment camera 210, the location of the alignment camera 210 may not be changed unless there are special circumstances. A special circumstance may be a case in which a long time has passed after the alignment camera 210 was initially fixed, or a position of the alignment camera 210 has been changed by an external force. Since the position of the alignment camera 210 is fixed in this way, the managing person's effort for the test system 200 can be reduced, and since the position of the actuator is measured at the fixed position, the alignment state of the actuator can be accurately determined. Also, in the image taken by the alignment camera 210, the object may always appear in the same size.

The test system 200 may include a test board driving unit 260. The test board driving unit 260 is coupled to the inside of the test board accommodating unit 311 and may be configured to move the test board 240 in a first direction or in a direction opposite to the first direction.

A lower side of the second directional movement stage may include a slider. The slider of the second direction moving stage is coupled to the second direction guide rail of the base stage to slide in a second direction or in a direction opposite to the second direction.

The test system 200 may include a test board 240. The test board 240 may be coupled to an upper side of the test board driving unit 260. In addition, the test board 240 may be configured to test the actuator on the support socket 230. The test board 240 may be coupled with an actuator to perform test.

As the test board 240 moves up and down, the connector of the test board may be coupled with the connector of the actuator.

Hereinafter, the operation of the test system 200 by means of the control unit 100 will be described in detail.

Figure 4:
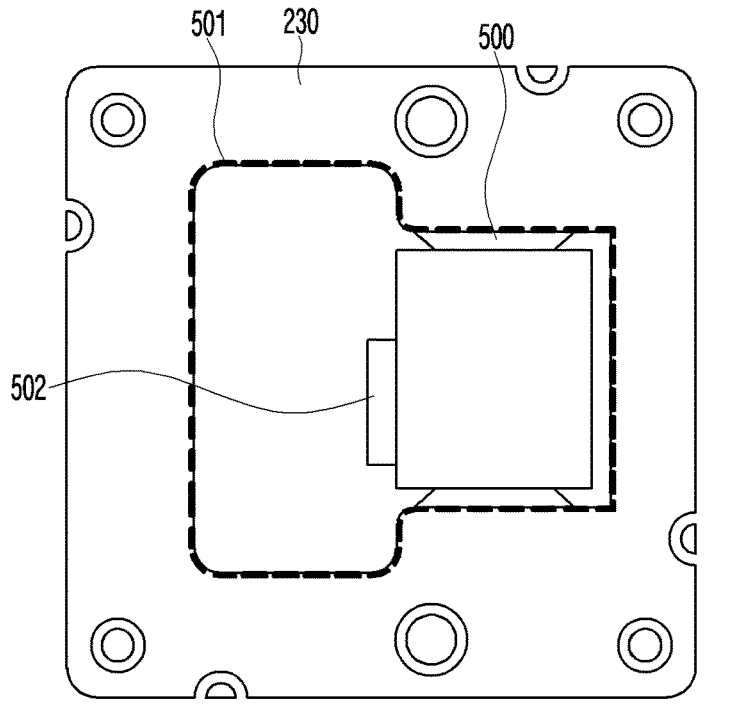
FIG. 4 explains why the test system according to an embodiment of the present disclosure needs to check the alignment of the actuator.

FIG. 4 explains why the test system according to an embodiment of the present disclosure needs to check the alignment of the actuators.

Referring to FIG. 4, a receiving groove 501 for accommodating the actuator 500 may be formed on the upper surface of the support socket 230. The actuator 500 may be accommodated in the receiving groove 501 of the support socket 230 for test. The accommodating groove 501 formed in the support socket 230 may be slightly larger than the size of the actuator 500 in order to easily accommodate the actuator 500. Accordingly, the actuator 500 can be moved minutely within the support socket 230. Also, there may be cases in which the connector 502 coupled to the actuator 500 is coupled to the actuator at an angle due to an error in the assembly process.

In a state in which the actuator 500 and the connector are not aligned, when the connector 502 of the actuator 500 is attempted to be coupled with the connector formed on the test board 240, the connector of the test board 240 or the connector 502 of the actuator may be damaged. Thus, an alignment of an actuator may need to be performed prior to test. Therefore, the following process is performed.

Figure 5:
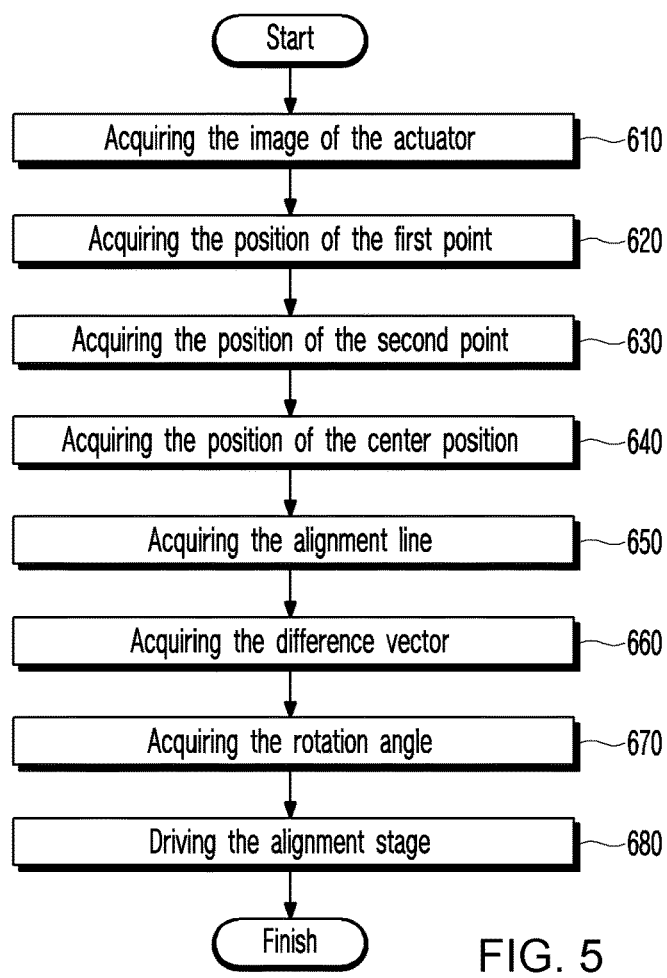
FIG. 5 is a flowchart illustrating an operation of a test system according to an embodiment of the present disclosure.
Figure 6:
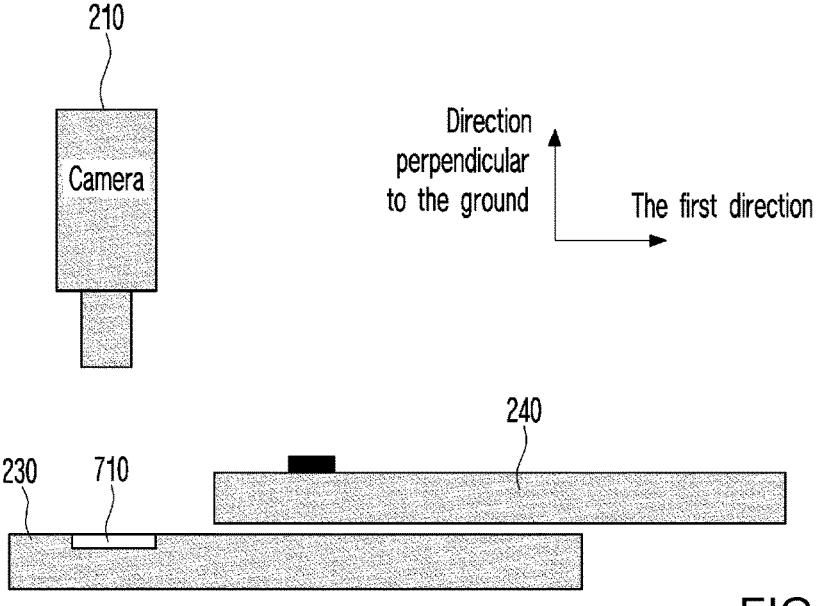
FIG. 6 is a view for explaining the operation of the test system according to an embodiment of the present disclosure.
Figure 7:
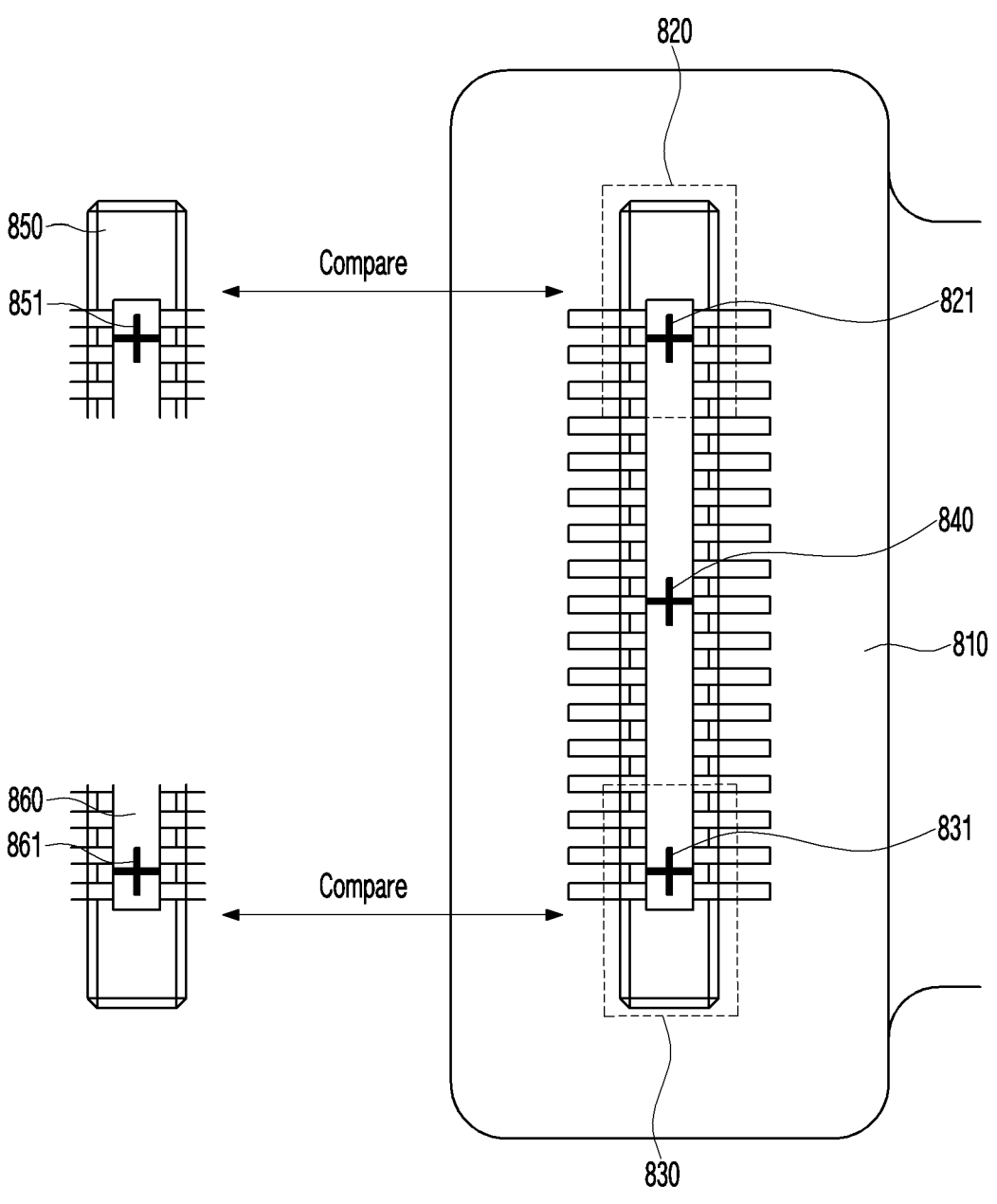
FIG. 7 is a view for explaining the operation of a test system according to an embodiment of the present disclosure.
Figure 8:
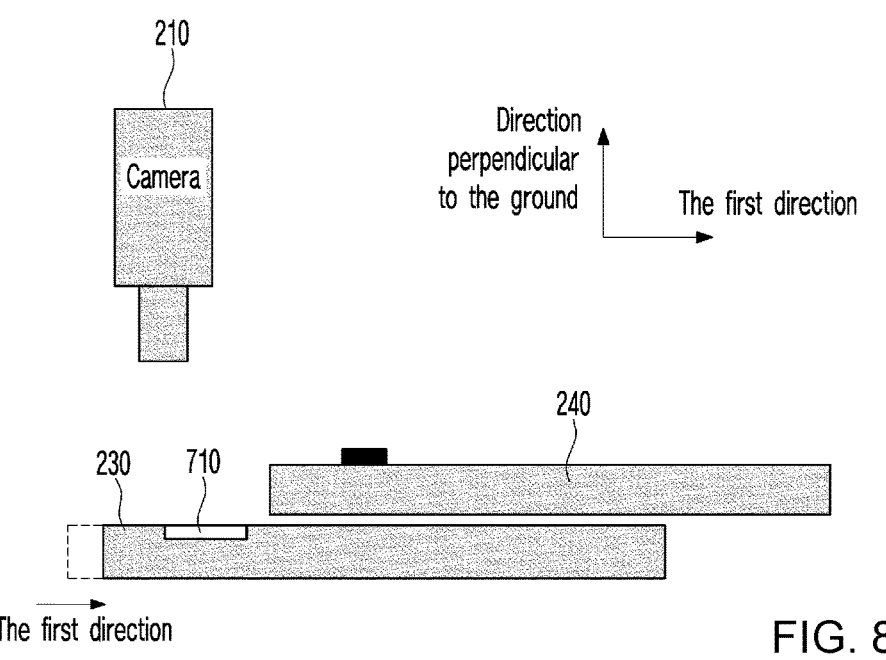
FIG. 8 is a view for explaining the operation of an test system according to an embodiment of the present disclosure.

FIG. 5 is a flowchart illustrating an operation of a test system according to an embodiment of the present disclosure. FIG. 6 is a view for explaining an operation of a test system according to an embodiment of the present disclosure. FIG. 7 is a view for explaining the operation of a test system according to an embodiment of the present disclosure. FIG. 8 is a view for explaining the operation of a test system according to an embodiment of the present disclosure.

Referring to FIGS. 5 and 6, the test system 200 may test the actuator 710. The test system 200 may perform the following process to test the actuator. More specifically, the control unit 100 may control components included in the test system 200 to perform the following operations.

The alignment camera 210 may perform step 610 of acquiring an image 810 of the actuator by photographing a predetermined area of the actuator 710 on the support socket 230. The predetermined area may be an area of a connector coupled to the actuator 710. For example, FIG. 7 may show an image 810 of an actuator captured in a predetermined area.

The control unit 100 may perform step 620 of comparing the image 810 of the actuator with the first pattern image 850 and obtaining the position 821 of the first point included in the image of the actuator. The first pattern image may be a pre-stored template image. The first pattern image may be an image stored in the control unit 100 before acquiring the image 810 of the actuator. The first pattern image may be an image of one side of the connector of the actuator.

The first pattern image 850 may include a positioning point 851 at a predetermined location. In FIG. 7, the positioning point 851 is displayed on the first pattern image 850 for convenience of description, but the positioning point 851 may not be displayed on the first pattern image. The control unit 100 may determine a specific position of the first pattern image 850 as a positioning point 851. The position of the positioning point 851 may be previously determined. The control unit 100 may store the coordinates of the positioning point 851 for the first pattern image. The positioning point 851 may be at least one of the center, upper left, upper right, lower left, or lower right points of the first pattern image 850, but not limited to this.

A step 620 of obtaining the location of the first point may further include the following process. The control unit 100 may perform step of determining a first area 820 most similar to the first pattern image 850 in the image 810 of the actuator. The size of the first area 820 may be the same as that of the first pattern image 850. To determine the first area 820, the control unit 100 may use a predetermined pattern matching algorithm. The control unit 100 may perform step of acquiring a position within the first area 820 corresponding to the position of the positioning point 851 of the first pattern image 850 as the position 821 of the first point.

Acquiring the position within the first area as the position 821 of the first point may include the following process. When the similarity between the first area 820 and the first pattern image 850 is less than a predetermined threshold similarity, the control unit 100 may perform step of outputting a signal indicating that there is an abnormality in the actuator 710. Both ends of the connector coupled to the actuator 710 may be crushed during a test or assembly process. The control unit 100 may obtain a similarity between the first pattern image 850 and the first area 820 in the actuator image 810. The control unit 100 determines the first area 820 most similar to the first pattern image 850 in the image 810 of the actuator, but when the obtained similarity is less than a predetermined threshold similarity, it may be determined that there is a problem with the image 810 of the actuator or the connector of the actuator 710. For example, the control unit 100 may determine that the connector of the actuator 710 is crushed. The control unit 100 may perform step of outputting a signal indicating that there is an abnormality in the actuator 710. Also, the control unit 100 may not perform steps 620 to 680. A user may take necessary actions based on the signal output from the test system 200.

When the similarity between the first area 820 and the first pattern image 850 is greater than or equal to the threshold similarity, the control unit 100 may perform step of acquiring a position within the first area 820 corresponding to the position of the positioning point of the first pattern image 850 as the position 821 of the first point. That is, when the similarity between the first area and the first pattern image is greater than or equal to the threshold similarity, the control unit 100 may perform steps 620 to 680.

The control unit 100 may perform step 630 of comparing the image 810 of the actuator with the second pattern image 860, and obtaining the position 831 of the second point included in the image 810 of the actuator. The second pattern image 860 may be a pre-stored template image. The second pattern image 860 may be an image stored in the control unit 100 before obtaining the image 810 of the actuator. The second pattern image 860 may be an image of the other side of the connector of the actuator. The other side of the connector shown in the second pattern image 860 may be the opposite side of the one side of the connector shown in the first pattern image 860.

The second pattern image 860 may include a positioning point 861 at a predetermined location. In FIG. 7, the positioning point 861 is displayed on the second pattern image 860 for convenience of explanation, but the positioning point 861 may not be displayed on the second pattern image 860. The control unit 100 may determine a specific position of the second pattern image 860 as a positioning point 861. The position of the positioning point 861 may be previously determined. The control unit 100 may store the coordinates of the positioning point 861 for the second pattern image 860. The positioning point 861 may be at least one of the center, upper left, upper right, lower left, or lower right points of the second pattern image 860, but not limited to this.

The second pattern image 860 may be a mirror image of the first pattern image 850 or an image rotated by 180 degrees. The size of the second pattern image 860 may be the same as that of the first pattern image 850. The second pattern image 860 may be a mirror image of the first pattern image 850 on a horizontal axis. The control unit 100 may determine a mirror image or 180-degree rotation image of the first pattern image 850 as the second pattern image 860. That is, the control unit 100 may determine the first pattern image 850 and the second pattern image 860 using one pattern image.

A step 630 of obtaining the position of the second point may further include the following process. The control unit 100 may perform step of determining a second region 830 most similar to the second pattern image 860 in the image 810 of the actuator. The size of the second region 830 may be the same as that of the second pattern image 860. To determine the second area 830, the control unit 100 may use a predetermined pattern matching algorithm. The control unit 100 may perform step of obtaining a position within the second area 830 corresponding to the position of the positioning point 861 of the second pattern image 860 as the position 831 of the second point.

A step of obtaining a position within the second area as the position of the second point may include the following process. When the similarity between the second region 830 and the second pattern image 860 is less than a threshold similarity, the control unit 100 may perform step of outputting a signal indicating that there is an abnormality in the actuator 710. Both ends of the connector coupled to the actuator 710 may be crushed during a test or assembly process. The control unit 100 may obtain a similarity between the second pattern image 860 and the second area 830 of the actuator image 810. The control unit 100 determines the most similar to the second pattern image 860 in the image 810 of the actuator, but when the obtained similarity is less than a predetermined threshold similarity, it may be determined that there is a problem with the image 810 of the actuator or the connector of the actuator 710. For example, the control unit 100 may determine that the connector of the actuator 710 is crushed. The control unit 100 may perform step of outputting a signal indicating that there is an abnormality in the actuator 710. Also, the control unit 100 may not perform steps 620 to 680. A user may take necessary actions based on the signal output from the test system 200.

When the similarity between the second area 830 and the second pattern image 860 is greater than or equal to the threshold similarity, a step of obtaining a position in the second area corresponding to the position of the positioning point of the second pattern image 860 as the position 831 of the second point may be performed. That is, when the similarity between the second area 830 and the second pattern image 860 is greater than or equal to the threshold similarity, the control unit 100 may perform steps 620 to 680.

After the step 630 of obtaining the position of the second point, the control unit 100 may perform the following process. After step 630, the control unit 100 may perform step of determining a difference distance between the position of the first point and the position of the second point. The control unit 100 may obtain the difference distance by subtracting the coordinate value of the position 831 of the second point from the coordinate value of the position 821 of the first point. Alternatively, the control unit 100 may obtain the difference distance by subtracting the coordinate value of the position 821 of the first point from the coordinate value of the position 831 of the second point. A unit of the difference distance may be the number of pixels.

The control unit 100 may perform step of determining an absolute value of a difference between the differential distance and the predetermined basic distance. The basic distance is a predetermined value, which may be stored by the control unit 100. A unit of the basic distance may be the number of pixels. The basic distance may be a length that a connector coupled to the actuator 710 must satisfy. The basic distance may be input in advance by a system designer and may be changed by a user's input.

The control unit 100 may obtain an absolute value after subtracting the differential distance from the basic distance. The control unit 100 may perform step of outputting a signal indicating that there is an abnormality in the actuator when the absolute value is greater than or equal to a predetermined tolerance. That is, when the difference between the difference distance and the basic distance is too large, the control unit 100 may determine that there is a problem with the connector of the actuator 710 or a problem with the image of the actuator 710. The control unit 100 may output a signal indicating that there is a problem with the connector of the actuator 710 or a problem with the image of the actuator 710. Also, the control unit 100 may not perform steps 620 to 680. A user may take necessary actions based on the signal output from the test system 200.

When the absolute value is less than a predetermined tolerance, the control unit 100 may perform step of acquiring the center position or alignment line. That is, the control unit 100 may perform steps 620 to 680.

The control unit 100 may perform step 640 of acquiring the central position 840 of the position 821 of the first point and the position 831 of the second point. Also, the control unit 100 may perform step 650 of obtaining an alignment line connecting the position 821 of the first point and the position 831 of the second point.

The control unit 100 may perform step 660 of obtaining a difference vector between the center position 840 and a predetermined reference position. The control unit 100 may obtain a difference vector by subtracting the coordinate value of the reference position from the coordinate value of the center position 840. However, the present invention is not limited thereto, and the control unit 100 may obtain a difference vector by subtracting the coordinate value of the center position 840 from the coordinate value of the reference position. As for the coordinate values, the x-axis value may increase toward the right, and the y-axis value may increase toward the bottom, starting with the upper-left pixel of the image 810 of the actuator as the origin. A difference vector can have a magnitude and a direction. A process of acquiring the reference position will be described later.

The control unit 100 may perform step 670 of obtaining a rotation angle between an alignment line and a predetermined reference line. The rotation angle may be a value having a rotation magnitude and a rotation direction. The control unit 100 may determine whether the alignment line is displaced clockwise or counterclockwise from the reference line in order to determine the rotation direction. Also, the control unit 100 may determine an angle formed between the reference line and the alignment line as the size of rotation. A method of acquiring the reference line will be described later.

Figure 9:
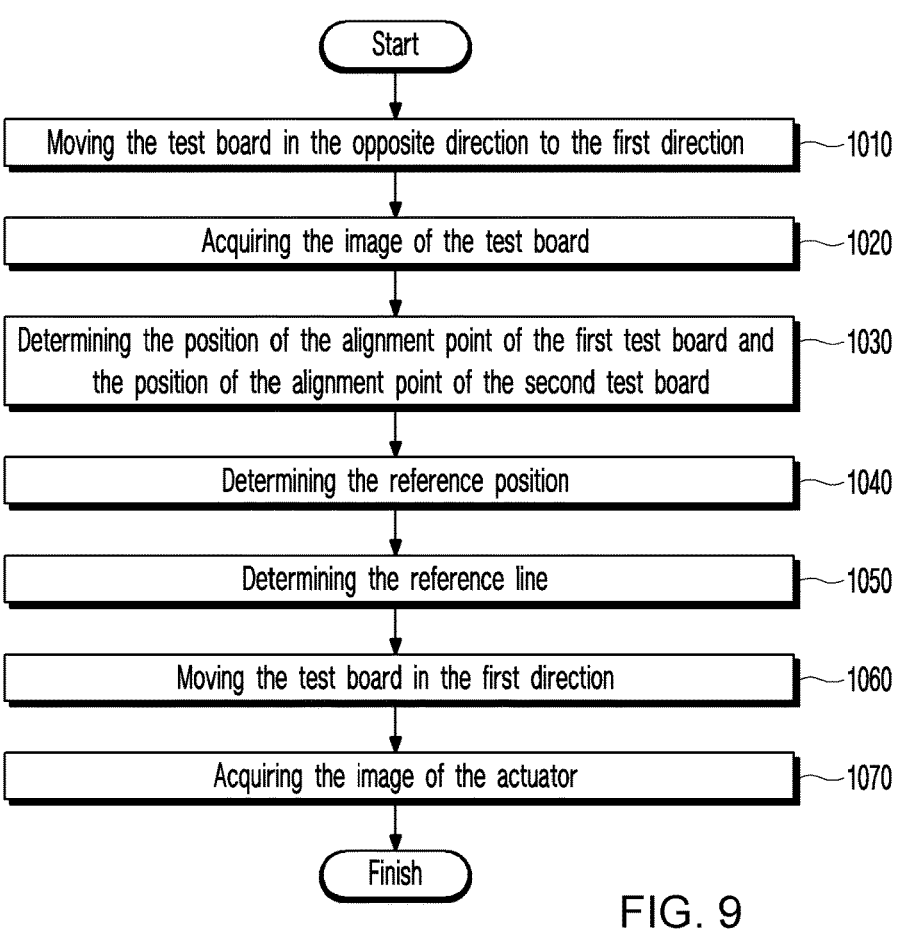
FIG. 9 is a flowchart illustrating an operation of an test system according to an embodiment of the present disclosure.

The control unit 100 may perform step 680 of driving the alignment stage based on at least one of a difference vector and a rotation angle so that the center position 840 is located at the reference position and the alignment line coincides with the predetermined reference line. More specifically, the control unit 100 may drive the first stage 410 or the second stage 420 based on the difference vector. The value of the x-axis of the difference vector may be related to the first stage 410, and the value of the y-axis of the difference vector may be related to the second stage 420. However, it is not limited thereto, and the value of the x-axis of the difference vector may be related to the second stage 420, and the value of the y-axis of the difference vector may be related to the first stage 410. Also, the control unit 100 may drive the third stage 430 based on the rotation angle. FIG. 9 illustrates a state in which the control unit 100 drives the first stage 410 or the second stage 420 based on the difference vector according to an embodiment of the present disclosure.

The control unit 100 previously stores information on how much the first stage 410 or the second stage 420 should be moved in which direction according to the direction (+/−) or magnitude of the difference vector in the x-axis direction. In addition, the control unit 100 previously stores information on how much the second stage 420 or the first stage 410 should be moved in which direction according to the direction (+/−) and magnitude of the difference vector in the y-axis direction. The control unit 100 may determine the size and direction of the motion of the first stage 410 and the second stage 420 by applying the difference vector to previously stored information. Also, the control unit 100 may control the first stage 410 and the second stage 420 to be moved based on the determined size and direction of the movement.

The control unit 100 may previously store information about how much the third stage 430 should be moved according to the size of the rotation angle. Also, the control unit 100 may previously store information about in which direction the third stage 430 should be moved according to the direction of the rotation angle. The control unit 100 may determine the size and direction of the movement of the third stage 430 by applying the rotation angle to previously stored information. Also, the control unit 100 may control the third stage 430 to be moved based on the determined size and direction of the movement.

The control unit 100 may repeat steps 610 to 680 so that the center position 840 is located at the reference position and the alignment line coincides with the predetermined reference line.

Hereinafter, a method for automatically determining a reference position and reference line will be described.

Figure 10:
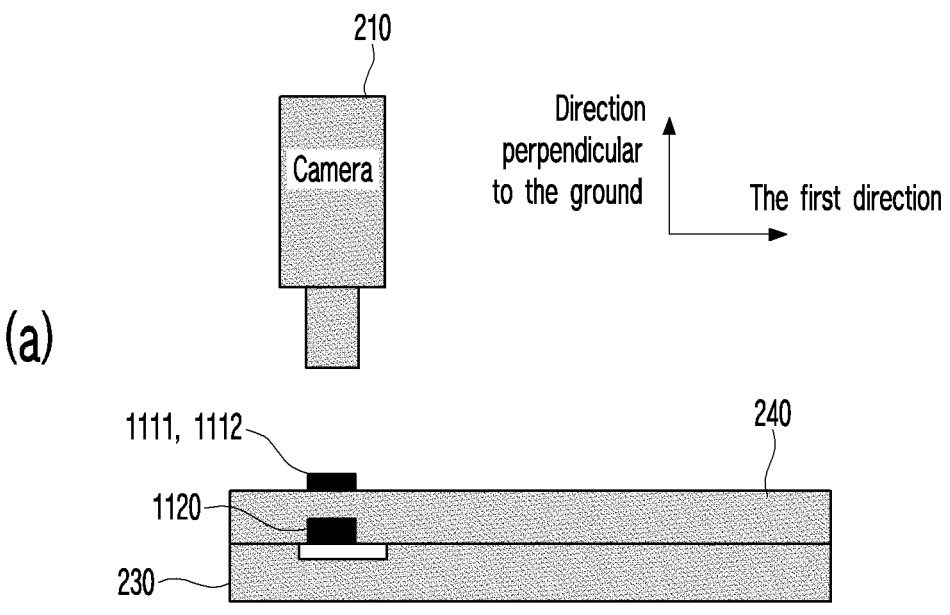
FIG. 10 is a view for explaining an operation of a test system according to an embodiment of the present disclosure.
Figure 10:
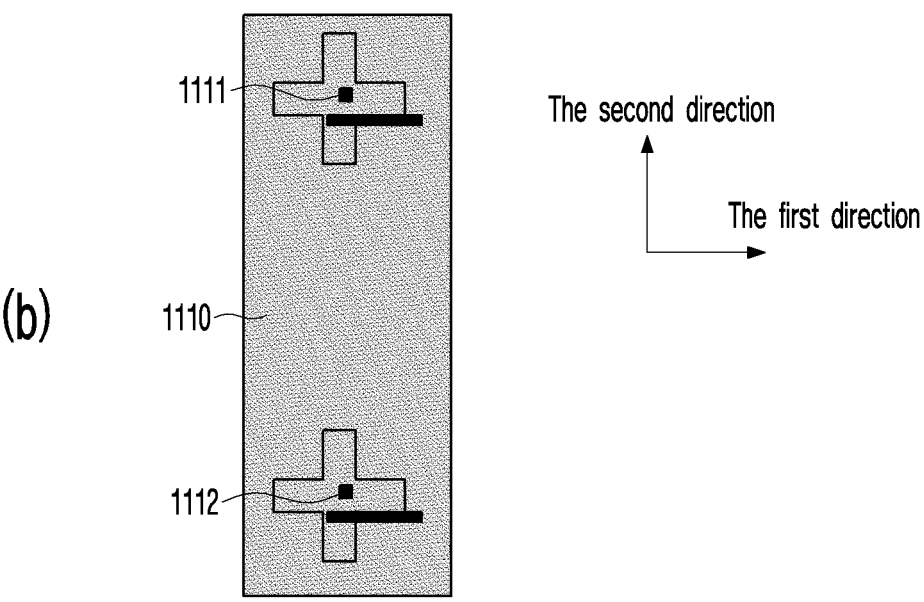

FIG. 9 is a flowchart illustrating an operation of a test system according to an embodiment of the present disclosure. FIG. 10 is a view for explaining an operation of a test system according to an embodiment of the present disclosure.

First, referring to FIG. 10, a first test board alignment point 1111 and a second test board alignment point 1112 may be displayed on the upper side of the test board 240. The first test board alignment point 1111 and the second test board alignment point 1112 may be formed along the second direction.

Based on the first test board alignment point 1111 and the second test board alignment point 1112 formed on the upper side of the test board 240, the control unit 100 may create a reference position and a reference line. The steps of FIG. 9 may be performed before the steps of FIG. 5 are performed. Also, the steps of FIG. 9 may not be performed every time the actuator is tested. When the steps of FIG. 9 are performed, since the reference position and reference line are determined, there may be no problem in testing a plurality of actuators thereafter. However, the steps of FIG. 9 may be performed at a predetermined cycle, initial setting is required, or may be performed before testing the actuator according to the user's needs.

The test system 200 may perform the following process. The control unit 100 may perform step 1010 of moving the test board 240 in a direction opposite to the first direction by using the test board driving unit. FIG. 10(*a*) may indicate a state in which step 1010 has been completed. Referring to FIG. 10(*a*), the test board may be positioned above the support socket 230 by step 1010. In step 1010, the test board 240 may be positioned between the alignment camera 210 and the support socket 230. Accordingly, the alignment camera 210 may photograph the test board 240. Moving the test board 240 in a direction opposite to the first direction may be moving the test board 240 to a test position. However, the actuator may not be mounted on the support socket 230, and in the step of FIG. 9, the test board 240 does not inspect the actuator, but may be used to create a reference position and reference line.

The control unit 100 may perform step 1020 of acquiring an image of the test board 240 using the alignment camera 210. The position of the alignment camera 210 in step 610 and step 1020 may be the same. However, since the support socket 230 is covered by the test board 240, the alignment camera 210 may obtain an image 1110 of the test board 240. An image 1110 of the test board 240 may be the same as that of FIG. 10 (*b*).

The control unit 100 may perform step 1030 of determining the position of the first test board alignment point and the position of the second test board alignment point in the image of the test board 240. As already described, the first test board alignment point 1111 and the second test board alignment point 1112 may be displayed on the upper surface of the test board 240. In addition, the first test board alignment point 1111 and the second test board alignment point 1112 may correspond to the position of the connector 1120 formed on the lower side of the test board 240. That is, one side of the connector 1120 may be located at a position corresponding to the first test board alignment point 1111 on the lower surface of the test board 240, and the other side of the connector 1120 may be located at a position corresponding to the second test board alignment point 1112 on the lower surface of the test board 240. The control unit 100 obtains the position of the first test board alignment point 1111 and the second test board alignment point 1112 in the image of the test board, thereby determining the position of the connector on the lower side of the test board 240.

The control unit 100 may perform step 1040 of determining the center of the position of the first test board alignment point 1111 and the position of the second test board alignment point 1112 as the reference position. The reference position may be the center of a connector located on the test board. Also, the center position 840 described above may be the center of a connector coupled to the actuator 710. By matching the reference position and the center position 840 in a later step 680, the positions of the connector of the test board and the connector of the actuator 710 can be aligned.

In addition, the control unit 100 may perform step 1050 of determining a line connecting the position of the first test board alignment point 1111 and the position of the second test board alignment point 1112 as a reference line. The reference line may indicate a longitudinal direction of the connector located on the test board. Also, the alignment line described above may indicate a longitudinal direction of a connector coupled to the actuator 710. By matching the reference line and the alignment line in a later step 680, the positions of the connector of the test board 240 and the connector of the actuator 710 can be aligned.

The control unit 100 may perform step 1060 of moving the test board in the first direction by using the test board driver. In step 1060, the actuator 710 may be placed on the support socket 230. Since the reference position and reference line are obtained by performing steps 1010 to 1050, the control unit 100 may perform steps for aligning the actuators as shown in FIG. 6. For example, the test system 200 may place the actuator 710 on the support socket 230. That is, the test system 200 may be in the state shown in FIG. 7. In addition, step 610 of obtaining an image of the actuator by photographing a predetermined area of the actuator 710 on the support socket by the alignment camera 210 may be performed.

Figure 11:
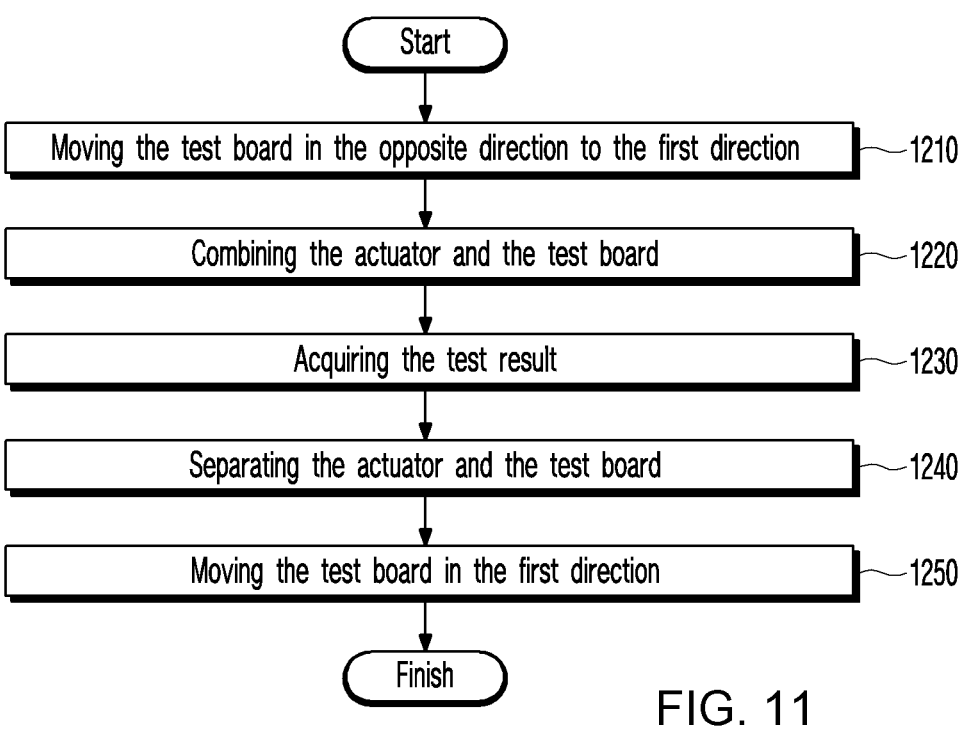
FIG. 11 is a flowchart illustrating an operation of a test system according to an embodiment of the present disclosure.
Figure 12:
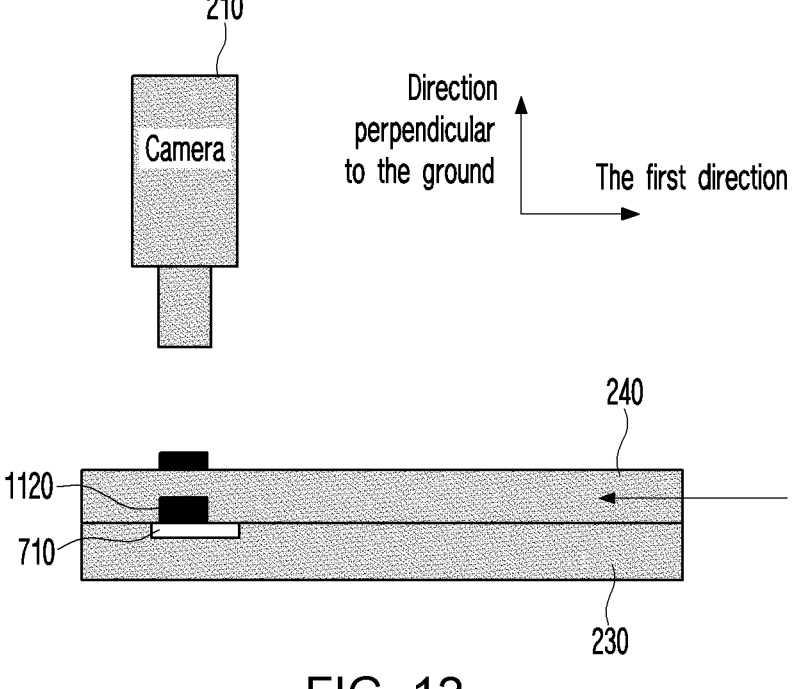
FIG. 12 is a view for explaining an operation of a test system according to an embodiment of the present disclosure.

FIG. 11 is a flowchart illustrating an operation of a test system according to an embodiment of the present disclosure. FIG. 12 is a view for explaining the operation of the test system according to an embodiment of the present disclosure.

The steps of FIG. 11 may be performed after the actuator is aligned by the steps included in FIG. 5.

After driving the alignment stage, the control unit 100 may perform step 1210 of moving the test board in a direction opposite to the first direction by using the test board driver. Moving the test board 240 in a direction opposite to the first direction may mean that the test board 240 is positioned above the actuator 710. Also, the connector of the test board 240 may be in a state capable of being coupled with the connector of the actuator 710. Because the steps of FIG. 11 are operations performed after the steps of FIG. 9 and the steps of FIG. 5, and the connector of the test board 240 is aligned with the connector of the actuator 710 by the steps of FIG. 5.

The control unit 100 may perform step 1220 of coupling the actuator on the support socket and the test board by moving the test board 240 downward. The test board 240 is lowered so that the connector of the test board 240 and the connector of the actuator 710 may contact each other. However, it is not limited thereto, and the test sub-board 241 included in the test board 240 descends so that the connector of the test board 240 and the connector of the actuator 710 may contact each other. By step 1210, the test system 200 may be in a state as shown in FIG. 12. Unlike FIGS. 6 and 8, it can be seen in FIG. 12 that the test board 240 is close to the support socket 230.

The control unit 100 may perform step 1230 of obtaining a test result by testing the actuator using the test board. After the connector of the test board 240 and the connector of the actuator 710 come into contact, the test board 240 may perform the test while exchanging signals with the actuator 710. In addition, the test board 240 may obtain a test result based on the movement of the actuator and the signal received from the actuator.

The control unit 100 may perform step 1240 of separating the actuator and the test board by moving the test board upward. That is, after obtaining the test result, the connector of the test board 240 and the connector of the actuator 710 may be separated. In addition, the control unit 100 may perform step 1250 of moving the test board in the first direction by using the test board driver. As such, the test system 200 can quickly align actuators using the hardware structure of FIG. 2 and the steps of FIG. 5 and accurately obtain test results by performing the steps of FIG. 11.

From now on, with reference to FIGS. 13 to 16, the component and operation of the integrated actuator test system according to an embodiment of the present disclosure will be described below.

Figure 13:
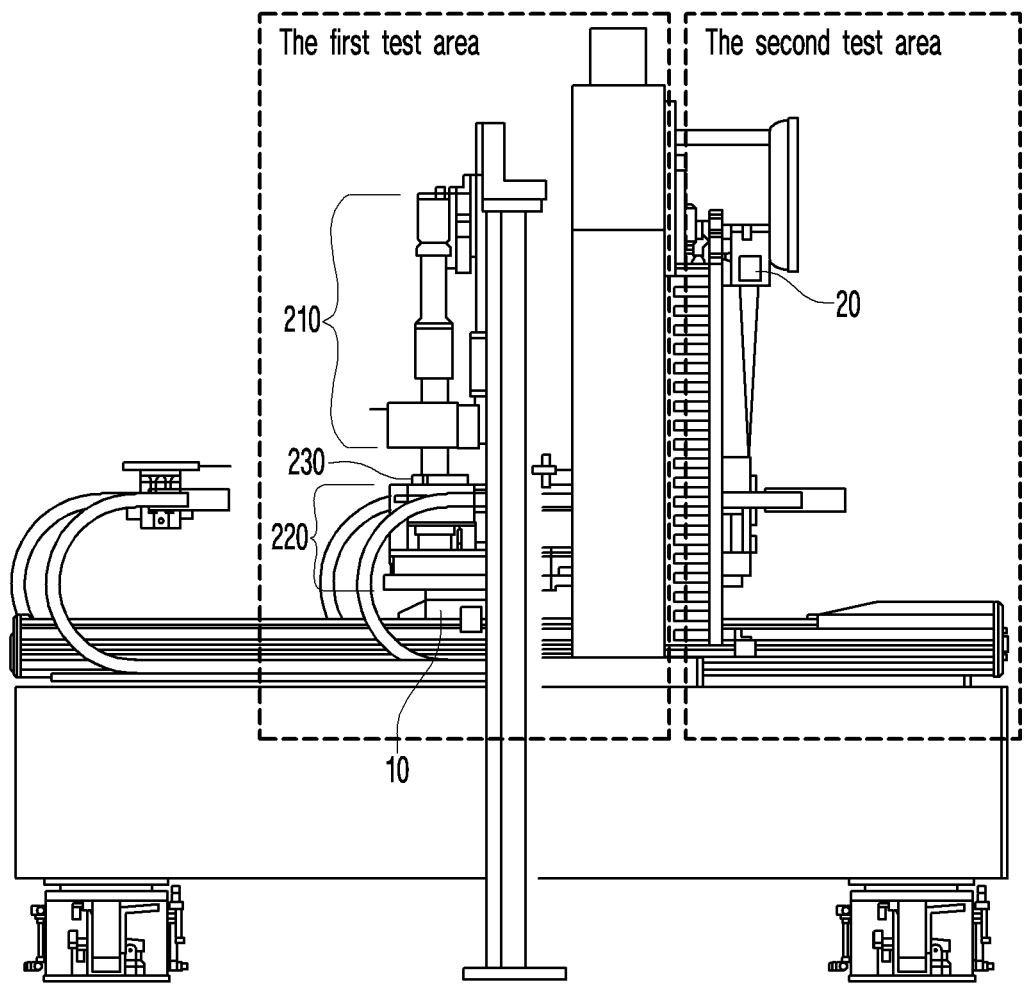
FIG. 13 is a view showing the component of an integrated actuator test system according to an embodiment of the present disclosure, it is a view showing a state when the actuator is located in a first test area.
Figure 14:
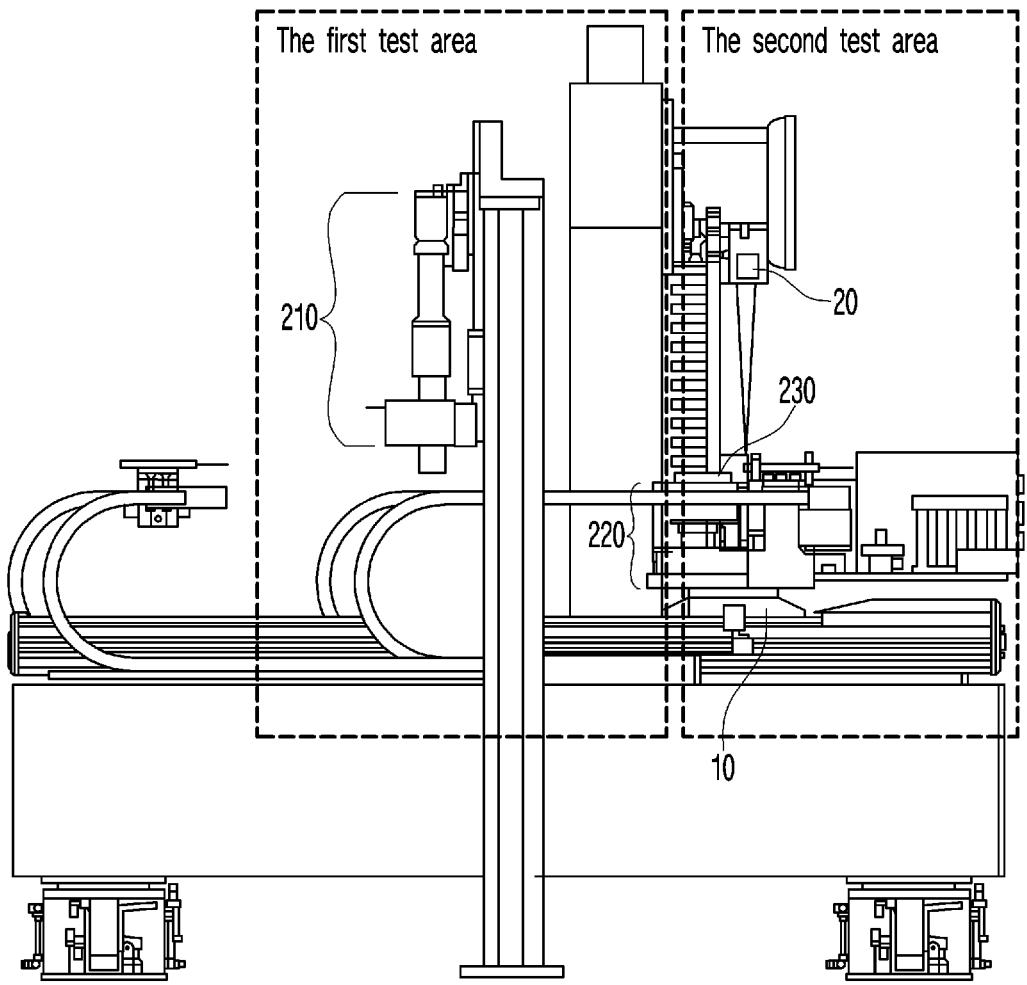
FIG. 14 As a view showing the component of an integrated actuator test system according to an embodiment of the present disclosure, it is a view showing a state when the actuator is located in the second test area.
Figure 15:
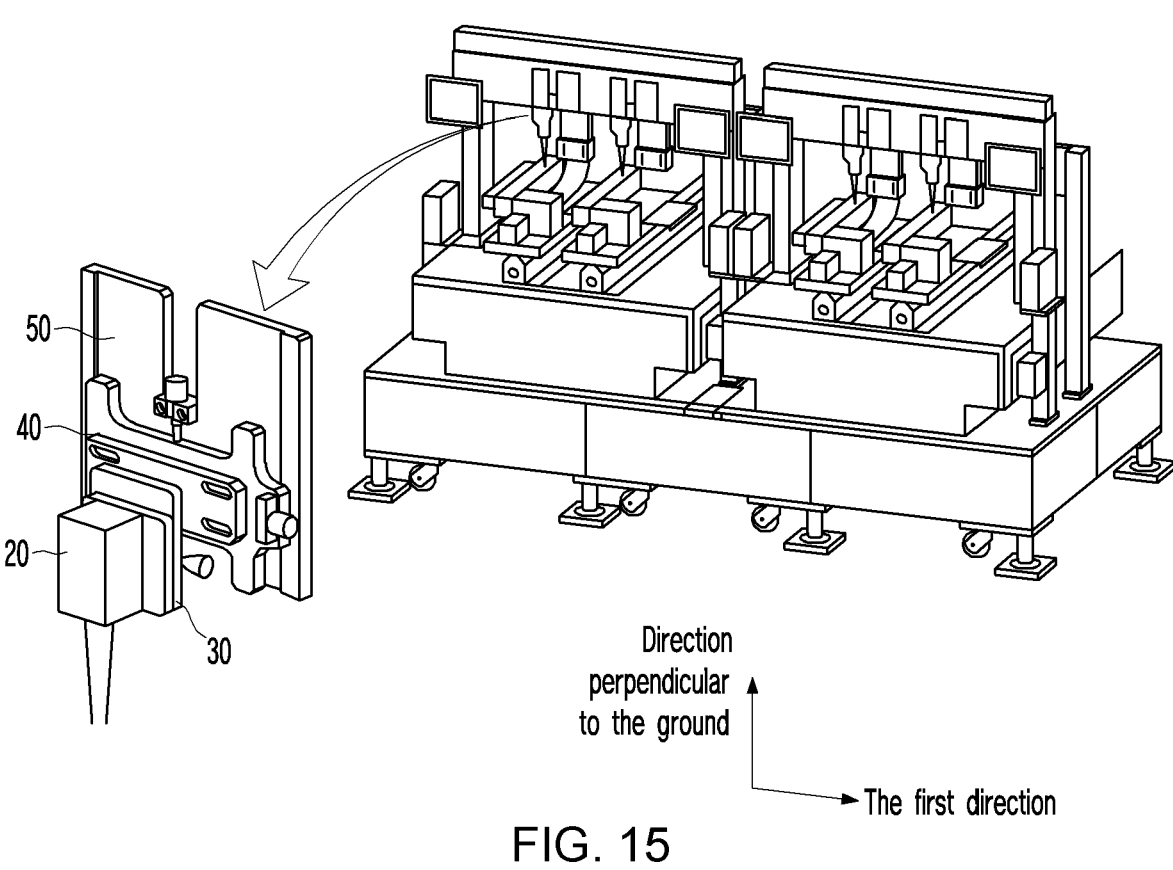
FIG. 15 is a view showing appearances of a measurement for a second test, a measurement alignment stage, a positioning unit, and a support plate according to an embodiment of the present disclosure.

FIG. 13 is a view showing the component of an integrated actuator test system according to an embodiment of the present disclosure, when the actuator is located in a first test area. FIG. 14 is a view showing the component of an integrated actuator test system according to an embodiment of the present disclosure, when the actuator is located in a second test area. FIG. 15 is a view showing appearances of a measurement for a second test, a measurement alignment stage, a position adjusting unit, and a support plate according to an embodiment of the present disclosure.

Referring to FIGS. 13 and 14, an integrated actuator test system (hereinafter, referred to as "this integrated test system") according to an embodiment of the present disclosure includes a first test area and a second test area. At this time, the test performed in the first test area and the test performed in the second test area both target the actuator, but test methods, test purposes, etc. may correspond to different tests.

If the component of this integrated test system is functionally divided, a component for performing a first test in a first test area, a component for performing a second test in a second test area, and a component (a transporting unit) moving an actuator from the first test area to the second test area can be classified. At this time, the component for performing the first test in the present integrated test system and the operating method of the component are the same as those of the test system 200 described with reference to FIGS. 1 to 12. Therefore, the description of the component and operation of performing the first test in the present integrated test system is replaced with the description of FIGS. 1 to 12. The appearance of the component for performing the first test shown in FIGS. 13 to 15 may be partially different from the appearance of the test system 200 shown in FIGS. 1 to 12, but this is only about the appearance, and there is no difference in the function and operation actually performed.

That is, this integrated test system is characterized by performing two different inspections as one system, and for this purpose, the existence of a transport unit 10 that transports the actuator to be tested from the first test area to the second test area is essential. In addition, the actuators (or the alignment stage 220 supporting the actuators) transported by the transporting unit 10 must be newly aligned for the second test in the second test area. To this end, components for aligning the alignment of the measurement 20 for the second test are essential in the second test area. That is, since the alignment of the test target is inevitably disturbed during the transportation process, a realignment process is necessary.

Referring to FIG. 13, this integrated inspection system performs a first test and a second test on an actuator to be tested, and includes the control unit 100 for controlling the operation of the integrated test system and the support socket 230 for supporting the actuator, and the alignment stage 220 for supporting the support socket 230 and determining the direction of the support socket 230 and/or the transporting unit 10 for transporting the alignment stage 220 to perform a second test after performing a first test.

Among the components of the integrated test system described in FIGS. 13 to 16, the components having the same function as the component of the test system 200 described in FIGS. 1 to 12 refer to the identification numbers assigned in FIGS. 1 to 12. Although used as it is, the component corresponds to a component that performs each function within this integrated test system.

Detailed descriptions of the control unit 100, the support socket 230, and/or the alignment stage 220 of the present integrated test system are replaced with the above description. However, the control unit 100 may control driving of the transporting unit 10.

The transporting unit 10 may correspond to a slider coupled to the guide rail in the second direction, and the transporting unit 10 may transport the actuator (or, a composite of the actuator and the alignment stage 220 supporting it) from the first test area to the second test area in a second direction.

FIG. 13 is a view showing an actuator or a composite of an actuator and an alignment stage 220 supporting the actuator is located in a first test area, and FIG. 14 is a view showing an actuator and the like is located in a second test area.

Referring to FIGS. 14 and 15, the present integrated test system may further include, for the second test, a measurement test apparatus 20 (also referred to herein as a measurement 20) performing the second test, and a measurement alignment stage 30 supporting the measurement 20 and determining the direction of the measurement 20, a position determining unit 40 (also as referred to as a positioning unit 40) supporting the measurement alignment stage 30 and determining the position of the measurement alignment stage 30, and/or a support plate 50 supporting the positioning unit 40.

The measurement 20 is a device that performs a second test different from the first test, and can measure the actuator transported by the transporting unit 10 to the second test area. At this time, the test performed by the measurement 20 may be various.

The measurement alignment stage 30 may adjust the measuring direction of the measurement 20 in all directions (four directions) in consideration of the flatness of the alignment stage 220 supporting the actuator at the position for the second test. That is, in the description of FIGS. 1 to 12, just as the alignment stage 220 is adjusted to align the alignment of the alignment camera 210 and the actuator (or the support socket 230 supporting the actuator), the measurement alignment stage 30 may be adjusted to match the alignment between the actuator (or the support socket 230 supporting the actuator and the alignment stage 220) and the measurement 20.

The positioning unit 40 may adjust the position of the measurement alignment stage 30 in a direction perpendicular to the ground and in a first direction. Ultimately, the measuring direction and position of the measurement 20 can be adjusted not only by the measurement alignment stage 30 but also by the positioning unit 40.

The support plate 50 supports and fixes the positioning unit 40, and the support plate 50 may be installed in an upper housing spaced apart from the base unit 250 in a direction perpendicular to the ground.

This integrated test system, for the first test, may further include an alignment camera 210 which is spaced apart from the upper side of the support socket 230 by a predetermined distance, and fixed at a predetermined position in order to photograph the alignment state of the actuator placed on the support socket 230, a test board driving unit 260 located in a first direction of the alignment stage 220 and moving the test board 240 in a first direction or in a direction opposite to the first direction, and/or a test board 240 coupled to the upper side of the test board driving unit 260 and testing actuator on the support socket 230, and further, the alignment stage 220 may include the first stage 410 for moving the support socket 230 in a second direction or in a direction opposite to the second direction, the second stage 420 coupled to the upper side of the first stage 410 to move the support socket 230 in a first direction or in a direction opposite to the first direction, and/or the third stage 430 coupled to the upper side of the second stage 420 to rotate the support socket 230 about an axis perpendicular to the ground. Meanwhile, the present integrated test system may include some or all of the components included in the test system 200 described above in the description of FIGS. 1 to 13 in addition to the above-described components.

Figure 16:
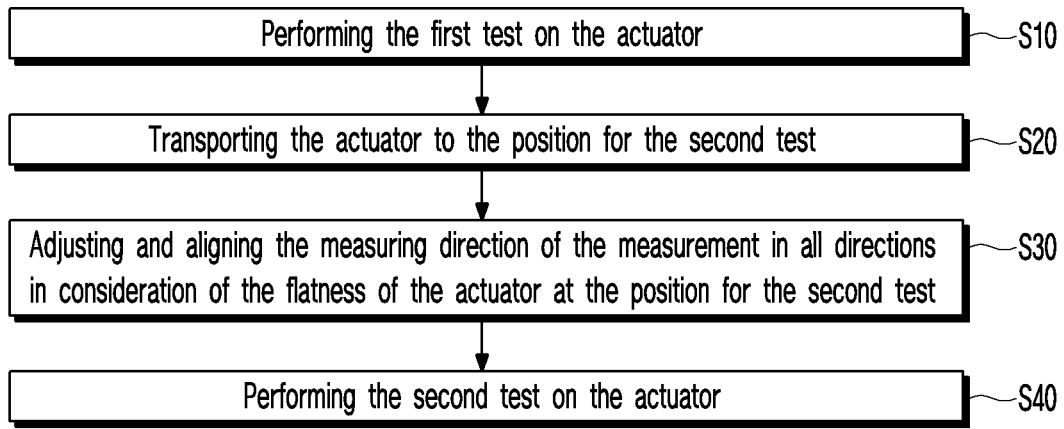
FIG. 16 is a flowchart illustrating an operation of an integrated actuator test system according to an embodiment of the present disclosure.

FIG. 16 is a flowchart illustrating an operation of an integrated actuator test system according to an embodiment of the present disclosure.

Referring to FIG. 16, the integrated test system may include a step S10 performing a first test on the actuator, a step S20 transporting the actuator to a position for the second test, a step S30 adjusting and aligning the measuring direction of the measurement 20 in all directions in consideration of the flatness of the actuator at the position for the second test, and/or a step S40 performing a second test on the actuator.

The detailed description of the operation of the integrated test system described above is replaced with the description of the integrated test system described above in FIGS. 13 to 15 and the test system 200 described above in FIGS. 1 to 12.

So far, we have looked at various embodiments. Those of ordinary skill in the art to which the present invention pertains will understand that the present invention can be implemented in a modified form without departing from the essential characteristics of the present invention. Therefore, the disclosed embodiments should be considered from an illustrative rather than a limiting point of view. The scope of the present invention is shown in the claims rather than the foregoing description, and all differences within the equivalent scope will be construed as being included in the present invention.

On the other hand, the above-described embodiments of the present invention can be written as a program that can be executed on a computer, and can be implemented in a general-purpose digital computer that operates the program using a computer-readable recording medium. The computer-readable recording medium includes storage media such as magnetic storage media (e.g., ROM, floppy disk, hard disk, etc.) and optical reading media (e.g., CD-ROM, DVD, etc.).

What is claimed is:

1. An integrated actuator test system that performs a first test and a second test on an actuator, the test system comprising:

a control unit controlling an operation of the test system;

a support socket supporting the actuator;

an alignment stage supporting the support socket and determining a direction of the support socket; and a transporting unit transporting the alignment stage to perform the second test after performing the first test;

wherein the test system, for the second test, comprises:

a measurement test apparatus performing the second test; and a measurement alignment stage supporting the measurement test apparatus and determining the direction of the measurement test apparatus; and wherein the test system, for the first test, further comprises:

an alignment camera spaced apart from the upper side of the support socket by a predetermined distance and fixed at a predetermined position to photograph an alignment state of the actuator placed on the support socket; and a test board moveable in a first direction of the alignment stage or in a direction opposite to the first direction, the test board for testing the actuator on the support socket, and wherein the first direction is a direction parallel to the ground, wherein the alignment stage comprises:

a first stage for moving the support socket in a second direction or in a direction opposite to the second direction;

a second stage coupled to the upper side of the first stage to move the support socket in the first direction or in a direction opposite to the first direction; and a third stage coupled to the upper side of the second stage to rotate the support socket about an axis perpendicular to the ground, and wherein the first direction and the second direction are directions perpendicular to each other, and wherein the alignment camera acquires an image of the actuator by photographing a predetermined area of the actuator on the support socket, and an image of the test board when the test board is positioned on the support socket, respectively, and wherein the image of the test board includes a reference line connecting a position of a first test board alignment point and a position of a second test board alignment point, the image of the actuator includes an alignment line connecting a position of a first point and a position of a second point, and wherein the alignment stage is driven so that the alignment line of the actuator image matches the predetermined reference line to align a connector of the test board with a connector of the actuator.

2. The test system according to claim 1, wherein the measurement alignment stage adjusts a measurement direction of the measurement alignment stage in all directions in consideration of a flatness of the alignment stage at a position for the second test.

* * * * *